United States Patent
Teramae et al.

(10) Patent No.: US 9,117,967 B2
(45) Date of Patent: Aug. 25, 2015

(54) METHOD OF MANUFACTURING GLASS SUBSTRATE WITH CONCAVE-CONVEX FILM USING DRY ETCHING, GLASS SUBSTRATE WITH CONCAVE-CONVEX FILM, SOLAR CELL, AND METHOD OF MANUFACTURING SOLAR CELL

(75) Inventors: Fumiharu Teramae, Nagoya (JP); Koichi Naniwae, Nagoya (JP); Tsukasa Kitano, Nagoya (JP); Toshiyuki Kondo, Nagoya (JP); Atsushi Suzuki, Nagoya (JP); Midori Mori, Nagoya (JP)

(73) Assignee: EL-SEED CORPORATION, Nagoya-Shi, Aichi (JP)

( * ) Notice: Subject to any disclaimer, the term of this patent is extended or adjusted under 35 U.S.C. 154(b) by 0 days.

(21) Appl. No.: 14/241,047

(22) PCT Filed: Aug. 29, 2012

(86) PCT No.: PCT/JP2012/071874
§ 371 (c)(1),
(2), (4) Date: Feb. 25, 2014

(87) PCT Pub. No.: WO2013/031851
PCT Pub. Date: Mar. 7, 2013

(65) Prior Publication Data
US 2014/0170799 A1 Jun. 19, 2014

(30) Foreign Application Priority Data
Aug. 30, 2011 (JP) .................................. 2011-188057

(51) Int. Cl.
*H01L 21/00* (2006.01)
*H01L 31/18* (2006.01)
(Continued)

(52) U.S. Cl.
CPC ............ *H01L 31/1884* (2013.01); *C03C 15/00* (2013.01); *C03C 17/36* (2013.01); *C03C 17/3678* (2013.01); *H01L 31/02366* (2013.01); *Y02E 10/50* (2013.01)

(58) Field of Classification Search
USPC .......................................................... 438/69
See application file for complete search history.

(56) References Cited

U.S. PATENT DOCUMENTS

| 8,404,136 B2 | 3/2013 | Kurisu et al. |
| 2003/0148401 A1* | 8/2003 | Agrawal et al. ................ 435/7.9 |

(Continued)

FOREIGN PATENT DOCUMENTS

| JP | 59-139004 A | 8/1984 |
| JP | 02-044087 A | 2/1990 |

(Continued)

OTHER PUBLICATIONS

International Search Report dated Dec. 11, 2012 in International Patent Application Publication No. PCT/JP2012/071874.

(Continued)

*Primary Examiner* — Asok K Sarkar
(74) *Attorney, Agent, or Firm* — McGinn IP Law Group, PLLC

(57) ABSTRACT

[Problem] A problem is to provide a method of manufacturing a glass substrate with a concave-convex film using dry etching capable of giving a fine concave-convex structure precisely by dry etching, a glass substrate with a concave-convex structure, a solar cell, and a method of manufacturing a solar cell.
[Means to Solve the Problem] In order to give a concave-convex structure to a glass substrate made of a plurality of oxides placed in different vapor pressures during dry etching, a subject film forming step and a concave-convex structure forming step are provided. The subject film forming step forms a subject film made of a single material on a flat surface of the glass substrate. The concave-convex structure forming step forms a periodic concave-convex structure in a surface of the subject film by dry etching. As a result, a fine concave-convex structure is formed precisely by dry etching.

13 Claims, 6 Drawing Sheets

(51) Int. Cl.
    *C03C 15/00* (2006.01)
    *C03C 17/36* (2006.01)
    *H01L 31/0236* (2006.01)

(56) References Cited

U.S. PATENT DOCUMENTS

| | | |
|---|---|---|
| 2011/0011831 A1 | 1/2011 | Kurisu et al. |
| 2011/0162710 A1 | 7/2011 | Watai et al. |

FOREIGN PATENT DOCUMENTS

| | | |
|---|---|---|
| JP | 06-264223 A | 9/1994 |
| JP | H6-287755 A | 10/1994 |
| JP | 2001-059175 A | 3/2001 |
| JP | 2003-004966 A | 1/2003 |
| JP | 2008-129319 A | 6/2008 |
| JP | 2009-071034 A1 | 4/2009 |
| JP | 2009-220329 A | 10/2009 |
| JP | 2009-238784 A | 10/2009 |
| JP | 2010-047427 A | 3/2010 |
| JP | 2010-153457 A | 7/2010 |
| JP | 2010-164890 A | 7/2010 |
| JP | 2011-014736 A | 1/2011 |
| JP | 2011-105974 A | 6/2011 |
| WO | WO 2009/096218 A1 | 8/2009 |
| WO | WO 2010/029751 A1 | 3/2010 |

OTHER PUBLICATIONS

Japanese Office Action dated Jul. 11, 2014 in Application No. 2013-270473 with an English translation thereof.
Japanese Office Action dated May 23, 2012 in Application No. 2011-188057 with an English translation thereof.
Notification of Reason(s) for Refusal dated Mar. 7, 2014, with English translation.
Japanese Office Action dated Dec. 8, 2014 with an English translation thereof.

* cited by examiner

METHOD OF MANUFACTURING GLASS SUBSTRATE WITH CONCAVE-CONVEX FILM USING DRY ETCHING, GLASS SUBSTRATE WITH CONCAVE-CONVEX FILM, SOLAR CELL, AND METHOD OF MANUFACTURING SOLAR CELL

TECHNICAL FIELD

This invention relates to a method of manufacturing a glass substrate with a concave-convex film using drying etching, a glass substrate with a concave-convex film, a solar cell, and a method of manufacturing a solar cell.

BACKGROUND ART

Patent literature 1 describes a known glass substrate including a surface with asperities. A smooth surface of a substrate is patterned by etching to form a pattern with a concave-convex area, thereby manufacturing such a glass substrate. More specifically, the surface of the glass substrate is etched to form a recess of the pattern with a concave-convex area to a depth smaller than a certain depth while an unetched area of the surface of the glass substrate becomes a protrusion. Next, a planar indenter with a smooth and flat surface is made to contact the protrusion tightly. The indenter is then pressed to form a compressed layer in the protrusion. Next, the indenter is removed and the glass substrate is etched with an acidic etchant to etch the compressed layer and an uncompressed layer except the compressed layer at different etching rates. As a result, the pattern with a concave-convex area having the recess of the certain depth is formed in the surface of the glass substrate.

However, this manufacturing method is not suitable for formation of fine asperities as it uses an indenter. This manufacturing method further encounters a problem of bad mass productivity as it cannot control a concave-convex area precisely because of direct processing on the glass substrate.

Patent literature 2 describes a known glass substrate with a light-scattering film that gives asperities to a glass substrate without processing the glass substrate directly. This glass substrate with a light-scattering film includes a light-scattering film composed of a silica-based film containing light-transmitting fine particles that is formed on a main surface of the substrate by sol-gel process. More specifically, the fine particles in the light-scattering film form at least secondary particles and the surface of the light-scattering film is given asperities reflecting the fine particles and the secondary particles.

CITATION LIST

Patent Literatures

Patent Literature 1: Japanese Unexamined Patent Application Publication No. 2010-47427
Patent Literature 2: Japanese Unexamined Patent Application Publication No. 2008-129319

SUMMARY OF INVENTION

Technical Problem

In the glass substrate with a light-scattering film of patent literature 2, the asperities are irregular as they reflect the particles. Further, the asperities cannot be smaller than the diameter of the particles.

This invention has been made in view of the aforementioned circumstances. It is an object of this invention to provide a method of manufacturing a glass substrate with a concave-convex film using drying etching capable of forming a fine concave-convex structure precisely by dry etching, a glass substrate with a concave-convex film, a solar cell, and a method of manufacturing a solar cell.

Solution to Problem

In order to achieve the aforementioned object, this invention provides a method of manufacturing a glass substrate with a concave-convex film using dry etching. The method comprises: a subject film forming step of forming a subject film made of a single material on a flat surface of a glass substrate, the glass substrate being made of a plurality of oxides whose vapor pressures during dry etching differ from each other; and a concave-convex structure forming step of forming a periodic concave-convex structure on a surface of the subject film by dry etching.

In the aforementioned method of manufacturing a glass substrate with a concave-convex film using dry etching, it is preferable that the concave-convex structure has period of less than 1 μm for asperities of the concave-convex structure.

This invention further provides a glass substrate manufactured by the aforementioned method of manufacturing a glass substrate with a concave-convex film using dry etching. According to this glass substrate, the concave-convex film has a refractive index substantially the same as that of the glass substrate.

This invention further provides a solar cell, comprising: the aforementioned glass substrate with a concave-convex film; and a photoelectric conversion layer provided to the glass substrate with a concave-convex film.

In the aforementioned solar cell, it is preferable that the concave-convex structure has period shorter than an optical wavelength corresponding to a wavelength of an absorption edge of the photoelectric conversion layer.

In the aforementioned solar cell, it is preferable that the solar cell comprises a transparent conductive film formed on the concave-convex film and that the photoelectric conversion layer is formed on the transparent conductive film.

This invention further provides a method of manufacturing the aforementioned solar cell. This method comprises a conductive film depositing step of depositing the transparent conductive film on the glass substrate with a concave-convex film to a thickness determined such that a concave-convex structure resulting from the concave-convex structure of the concave-convex film is formed in a surface of the transparent conductive film.

Advantageous Effects of Invention

This invention is capable of giving a fine concave-convex structure precisely to a glass substrate by dry etching.

DESCRIPTION OF EMBODIMENTS

Figure 1:
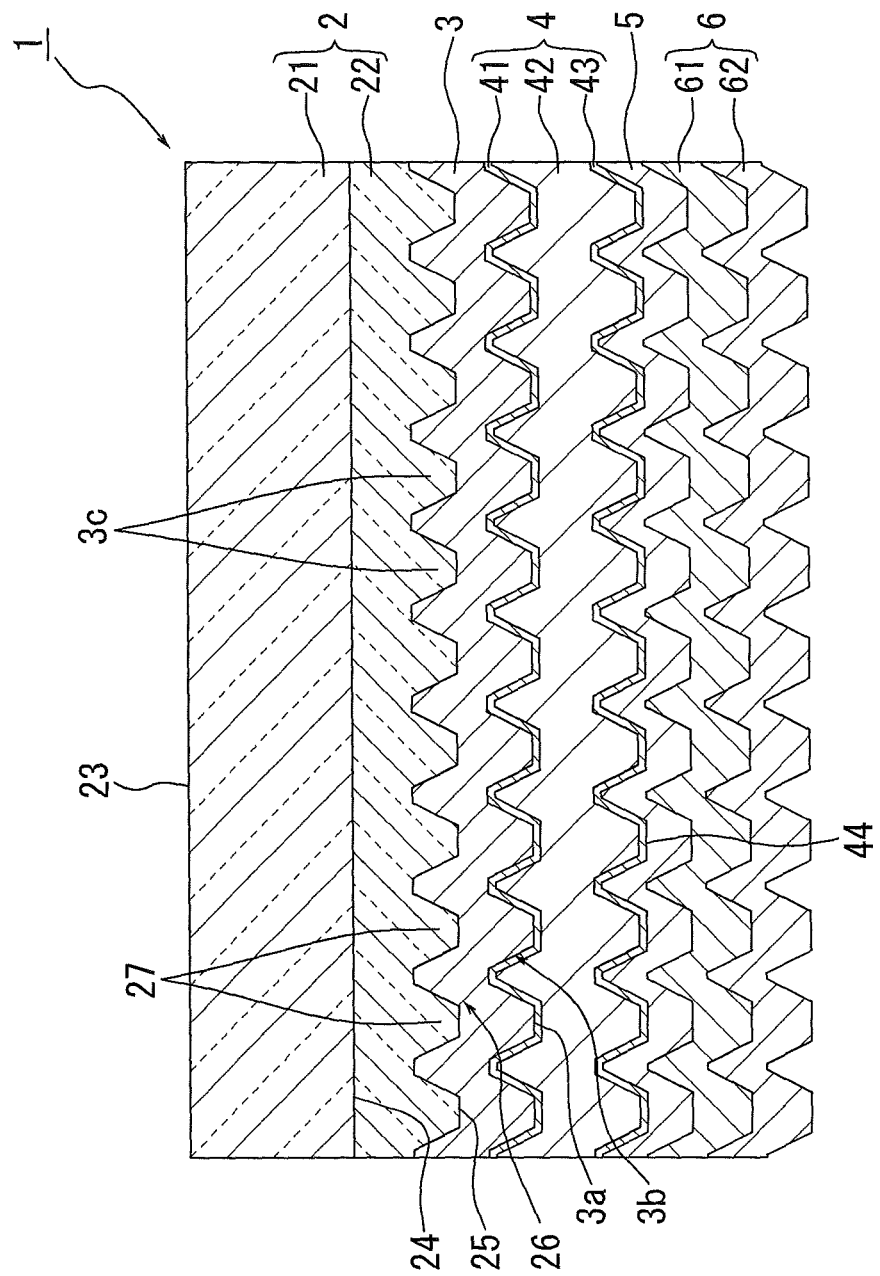
FIG. 1 is a schematic sectional view of a solar cell showing an embodiment of this invention.
Figure 2A:
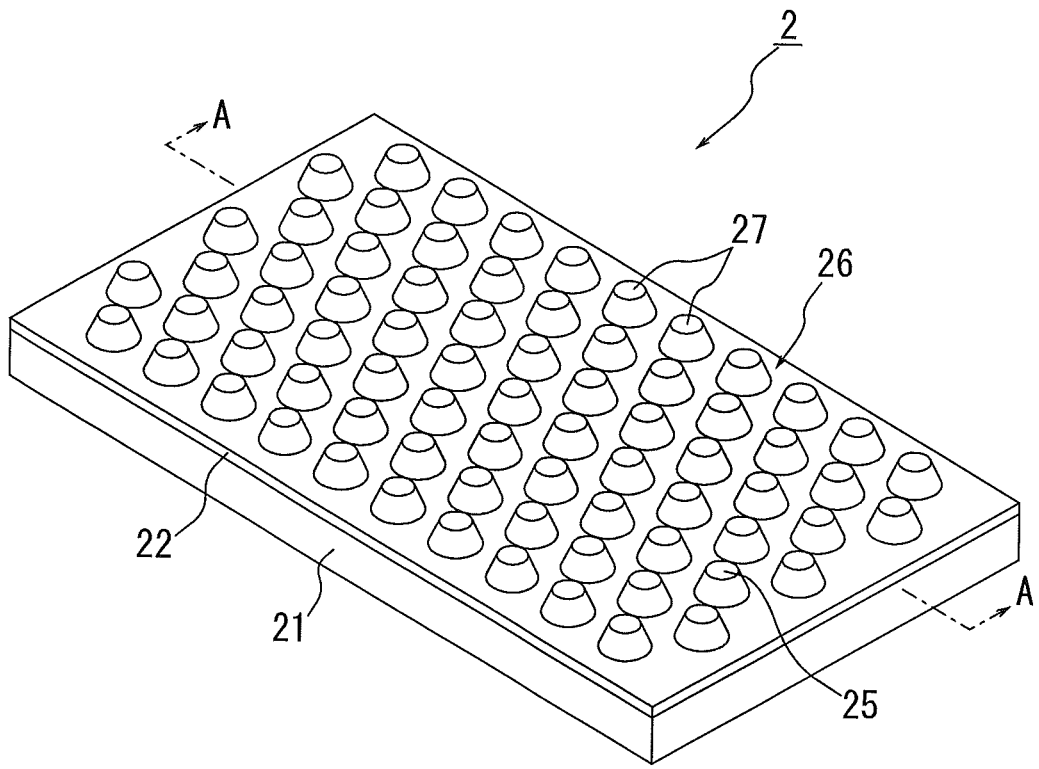
FIG. 2(a) is a schematic perspective view that shows a glass substrate with a concave-convex film.
Figure 2B:
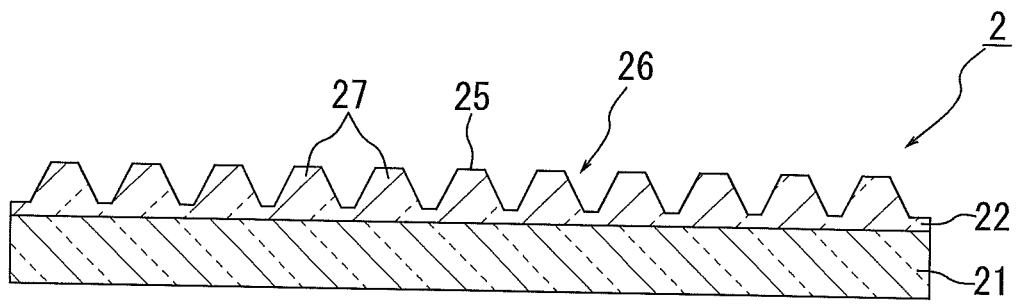
FIG. 2(b) is a schematic explanatory view showing a section taken along A-A.

FIGS. 1 to 4 show an embodiment of this invention. FIG. 1 is a schematic sectional view of a solar cell.

As shown in FIG. 1, a solar cell 1 includes a glass substrate 2 with a concave-convex film, a transparent conductive film 3 formed on the glass substrate 2 with a concave-convex film, a photoelectric conversion layer 4 formed on the transparent conductive film 3, a back surface reflection layer 5 formed on the photoelectric conversion layer 4, and a back surface electrode layer 6 formed on the back surface reflection layer 5. The solar cell 1 converts light having entered the solar cell 1 from the glass substrate 2 to electricity at the photoelectric conversion layer 4. Here, the glass substrate 21 is described as being on an upper surface side (top surface side) of the solar cell 1, whereas the back surface electrode layer 6 is described as being on a lower surface side (back surface side) of the solar cell 1.

The glass substrate 2 with a concave-convex film includes a glass substrate 21 and a concave-convex film 22. The glass substrate 21 is made for example of $SiO_2$—$Al_2O_3$ based glass, and has a flat upper surface 23 and a flat lower surface 24. As the glass for forming the glass substrate 21, $SiO_2$—$B_2O_3$ based glass may be used as well as $SiO_2$—$Al_2O_3$ based glass. The glass may or may not contain an alkaline component. And the glass substrate 21 has a thickness of 700 μm, for example.

The concave-convex film 22 is made of, for example, $SiO_2$ and is formed on the lower surface 24 of the glass substrate 2. The concave-convex film 22 can be made of $Al_2O_3$, for example. The concave-convex film 22 has a refractive index substantially the same as that of the glass substrate 2. If the refractive index of the concave-convex film 22 with respect to that of the glass substrate 21 differs from that of the glass substrate 21 by 15% or less, it can be said that these refractive indexes are substantially the same. If the concave-convex film 22 is made of $SiO_2$, it is given a refractive index of 1.45. If the glass substrate 21 is made of $SiO_2$—$Al_2O_3$ based glass, it is given a refractive index of from 1.5 to 1.6. Accordingly, it can be said that these refractive indexes are substantially the same. If the concave-convex film 22 is made of $Al_2O_3$, it is given a refractive index of 1.76. Assuming that the glass substrate 21 has a refractive index of 1.53 or more in this case, a difference therebetween can be 15% or less. It is preferable that the concave-convex film 22 be made of a material of a refractive index intermediate between that of the glass substrate 21 and that of the transparent conductive film 3.

The concave-convex film 22 has a concave-convex structure 26 formed in a lower surface 25. The concave-convex structure 26 has multiple periodically formed protrusions 27. Recesses are formed between corresponding ones of the protrusions 27. Each protrusion 27 may be shaped as a cone such as a circular cone or a polygonal cone. Each protrusion 27 can also be shaped as a frustum such as a circular or polygonal frustum formed by cutting out upper part of a cone. Instead of the protrusions 27, the recess can be shaped as a cone, a circular frustum, or a polygonal frustum, for example. In this embodiment, the period of the protrusions 27 is shorter than an optical wavelength corresponding to a wavelength of an absorption edge of the photoelectric conversion layer 4, and is set at 300 nm, for example. The period of the protrusions 27 can be changed appropriately so as not to fall below 200 nm and not to exceed 600 nm, for example. In this embodiment, the thickness of the concave-convex film 22 including the protrusions 27 is 1 μm and the height of the protrusions 27 is 200 nm. The height of the protrusions 27 can be changed appropriately so as not to fall below 100 nm and not to exceed 400 nm, for example. It is preferable that an aspect ratio determined by dividing the height of the protrusions 27 by the period of the protrusions 27 be less than 1.

The transparent conductive film 3 made of a transparent conductive oxide material is formed on the concave-convex film 22. In this embodiment, the transparent conductive film 3 is made of $SnO_2$, has a refractive index of 2.0, and has a thickness of from 0.3 to 2.0 μm, for example. A different oxide material such as ZnO doped with Al, Ga or B can be used as the transparent conductive film 3. The refractive index of ZnO is 1.95.

The transparent conductive film 3 has a concave-convex structure 3b formed in a lower surface 3a. The concave-convex structure 3b of the transparent conductive film 3 has the same shape and the same period as those of the concave-convex structure 26 of the concave-convex film 22. Specifically, in this embodiment, the concave-convex structure 3b has multiple periodically formed protrusions 3c. Recesses are formed between corresponding ones of the protrusions 3c. Each protrusion 3c may be shaped as a cone such as a circular cone or a polygonal cone. Each protrusion 3c can also be shaped as a frustum such as a circular or polygonal frustum formed by cutting out upper part of a cone. Instead of the protrusions 3c, the recess can be shaped as a cone, a circular frustum, or a polygonal frustum, for example. In this embodiment, like in the concave-convex film 22, the period of the concave-convex structure 3b of the transparent conductive film 3 is shorter than an optical wavelength corresponding to the wavelength of the absorption edge of the photoelectric conversion layer 4.

The photoelectric conversion layer 4 on the transparent conductive film 3 is composed of semiconductor layers of a pin structure including a p-type semiconductor layer 41, an i-type semiconductor layer 42, and an n-type semiconductor layer 43 stacked sequentially. The photoelectric conversion layer 4 can be used as a semiconductor material containing silicon such as a-Si, μc-Si or a-SiGe, or a mixture of these semiconductor material, for example. In this embodiment, the p-type semiconductor layer 41, the i-type semiconductor layer 42, and the n-type semiconductor layer 43 are each composed of an amorphous silicon film and have respective thicknesses of 10 nm, 400 nm and 10 nm, for example. In this embodiment, a lower surface of the photoelectric conversion layer 4 is given a concave-convex structure having the same shape and the same period as those of the concave-convex structure 3b of the transparent conductive film 3. The lower surface of the photoelectric conversion layer 4 is not always required to be given a concave-convex structure.

The wavelength of an absorption edge of amorphous silicon is from about 620 to about 830 nm. Light of a shorter wavelength can be absorbed by amorphous silicon. If the concave-convex film 22 is made of $SiO_2$, an optical wavelength determined in the concave-convex film 22 corresponding to the wavelength of this absorption edge is from about 430 to about 570 nm. If the transparent conductive film 3 is made of $SnO_2$, an optical wavelength determined in the transparent conductive film 3 corresponding to the wavelength of this absorption edge is from about 310 nm to about 420 nm. In this embodiment, the period of each of the concave-convex structures 26 and 3b is shorter than a corresponding optical wavelength.

It is desirable that the back surface reflection layer 5 and the back surface electrode layer 6 formed on and above the photoelectric conversion layer 4 be made of a material of a high conductivity and a high reflectance. In this embodiment, the back surface reflection layer 5 is made of ZnO doped with Al, Ga or B and has a thickness of 50 nm. In this embodiment, the back surface electrode layer 6 is a film which comprises an Al layer 62 stacked on the Ag layer 61. The respective thicknesses of the Ag layer 61 and the Al layer 62 are 75 nm. The material for the back surface reflection layer 5 and that for the back surface electrode layer 6 can be appropriately changed.

In the solar cell 1 of the aforementioned structure, after sunlight enters the solar cell 1 from the glass substrate 2 with a concave-convex film, free carriers are generated in the i-type semiconductor layer 42 of the photoelectric conversion layer 4. Electrons of the resultant free carriers are transferred toward the back surface electrode layer 6 by a built-in electric field formed by the p-type semiconductor layer 41 and the n-type semiconductor layer 43, while holes are transferred toward the transparent conductive film 3 to generate a current. The current is extracted to the outside through a terminal connected to the transparent conductive film 3 and the back surface electrode layer 6.

The glass substrate 21 and the concave-convex film 22 have substantially the same refractive index. This can inhibit Fresnel reflection of incident light from occurring at a boundary therebetween. Thus, forming the concave-convex film 22 on the glass substrate 21 causes substantially no loss due to reflection at this boundary.

The presence of the concave-convex structure 26 of the concave-convex film 22 can inhibit Fresnel reflection from occurring at a boundary between the concave-convex film 22 and the transparent conductive film 3. In this embodiment, the period of the concave-convex structure 26 is shorter than an optical wavelength corresponding to the wavelength of the absorption edge of the photoelectric conversion layer 4. This allows light of a wavelength band permitting photoelectric conversion to enter the transparent conductive film 3 without loss.

The concave-convex structure 3b of the transparent conductive film 3 can also inhibit Fresnel reflection from occurring at a boundary between the transparent conductive film 3 and the photoelectric conversion layer 4. In this embodiment, the period of the concave-convex structure 3b is shorter than an optical wavelength corresponding to the wavelength of the absorption edge of the photoelectric conversion layer 4. This allows entry of light into the photoelectric conversion layer 4. As a result, compared to entry of light into a photoelectric conversion layer using scattering at a concave-convex boundary, the solar cell 1 can dramatically improve the power generating efficiency.

Figure 3A:
FIG. 3(a) is a view explaining manufacture of the glass substrate with a concave-convex film that shows a glass substrate.
Figure 3B:
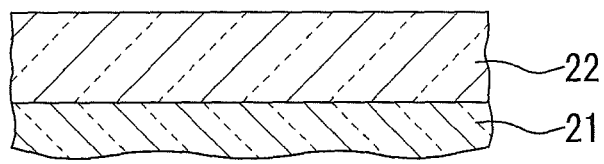
FIG. 3(b) is a view explaining manufacture of the glass substrate with a concave-convex film that shows a condition where a concave-convex film is formed on a back surface of the glass substrate while asperities are yet to be formed in the concave-convex film.
Figure 3C:
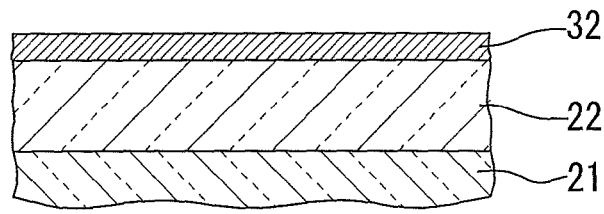
FIG. 3(c) is a view explaining manufacture of the glass substrate with a concave-convex film that shows a condition where a resist layer is formed on a back surface of the concave-convex film.
Figure 3D:
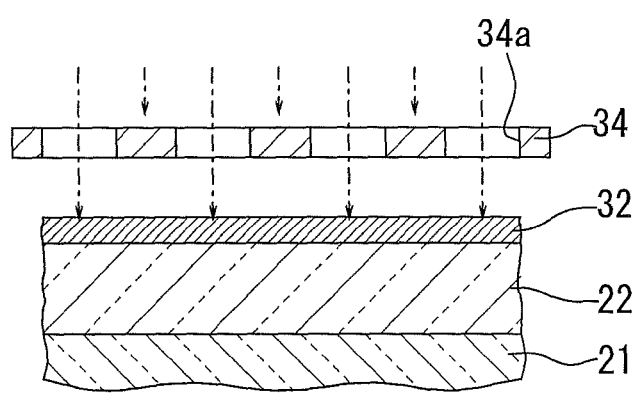
FIG. 3(d) is a view explaining manufacture of the glass substrate with a concave-convex film that shows a condition where the resist layer is selectively irradiated with electron beams.
Figure 3E:
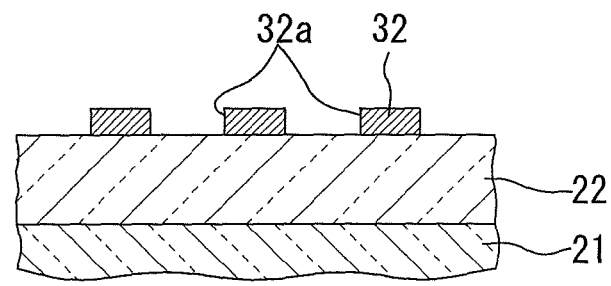
FIG. 3(e) is a view explaining manufacture of the glass substrate with a concave-convex film that shows a condition where the resist layer is developed and removed.
Figure 3F:
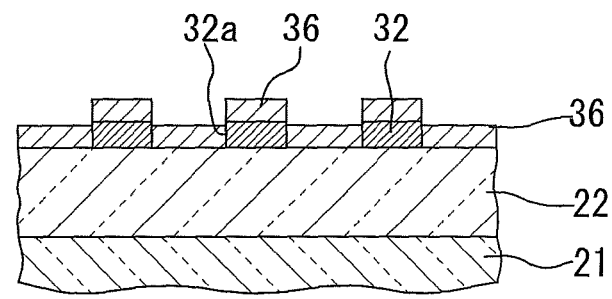
FIG. 3(f) is a view explaining manufacture of the glass substrate with a concave-convex film that shows a condition where a mask layer is formed.
Figure 4:
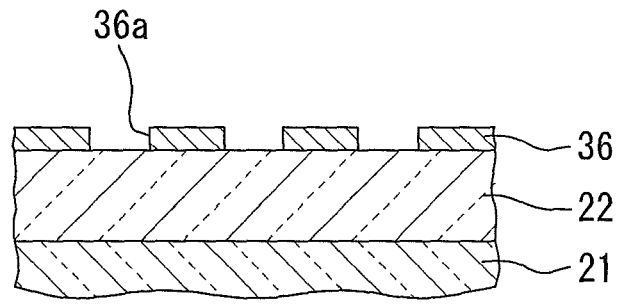
FIG. 4(a) is a view explaining manufacture of the glass substrate with a concave-convex film that shows a condition where the resist layer is removed completely.
FIG. 4(b) is a view explaining manufacture of the glass substrate with a concave-convex film that shows a condition where the concave-convex film is etched using the mask layer as a mask.
FIG. 4(c) is a view explaining manufacture of the glass substrate with a concave-convex film that shows a condition where the mask layer is removed.
Figure 4:
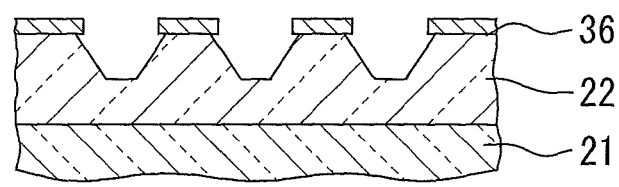
Figure 4:
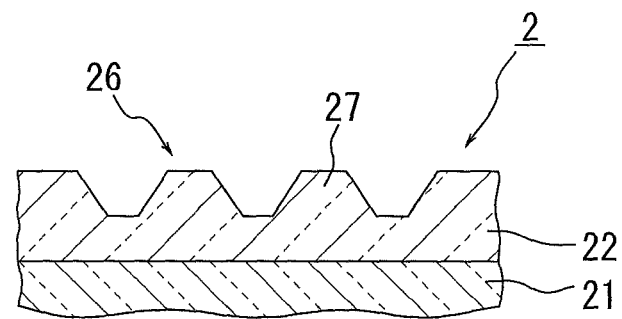

A method of manufacturing the glass substrate 2 with a concave-convex film is described by referring to FIGS. 3 and 4. FIG. 3 is a view explaining manufacture of the glass substrate with a concave-convex film: (a) shows a glass substrate; (b) shows a condition where a concave-convex film is formed on a back surface of the glass substrate while asperities are yet to be formed in the concave-convex film; (c) shows a condition where a resist layer is formed on a back surface of the concave-convex film; (d) shows a condition where the resist layer is selectively irradiated with electron beams; (e) shows a condition where the resist layer is developed and removed; and (f) shows a condition where a mask layer is formed.

First, as shown in FIG. 3(a), the glass substrate 21 shaped as a flat plate is prepared. Then, as shown in FIG. 3 (b), the concave-convex film 22 is formed as a subject film on the lower surface 24 of the glass substrate 21 (subject film forming step). The thickness of the concave-convex film 22 is only required to allow formation of the concave-convex structure 26 and is determined arbitrarily. As an example, the thickness of the concave-convex film 22 is 1 μm. In this embodiment, the concave-convex film 22 is made of $SiO_2$ and is formed by sputtering process, vacuum deposition process or CVD process, for example.

Next, as shown in FIG. 3 (c), a resist layer 32 is formed on the concave-convex film 22 on the glass substrate 21 (resist layer forming step). The resist layer 32 is made of a material photosensitive to an electron beam such as ZEP available from Zeon Corporation. The resist layer 32 is applied onto the concave-convex film 22. The resist layer 32 has any thickness ranging from 100 nm to 2.0 μm, for example.

Next, as shown in FIG. 3 (d), a stencil mask 34 is placed to be away from the resist layer 32 (stencil mask placing step). The resist layer 32 and the stencil mask 34 are distanced by a gap of from 1.0 μm to 100 μm. The stencil mask 34 is made of a material such as diamond or SiC and has any thickness ranging from 500 nm to 100 μm, for example. The stencil mask 34 has openings 34a that let electron beams to pass therethrough selectively.

Next, the stencil mask 34 is irradiated with electron beams to expose the resist layer 32 to an electron beam having passed through each opening 34a of the stencil mask 34 (electron beam irradiation step). More specifically, a pattern of the stencil mask 34 is transferred to the resist layer 32 using electron beams of from 10 to 100 $\mu C/cm^2$.

After the irradiation with the electron beams, the resist layer 32 is developed using a certain developer. This makes the parts irradiated with the electron beams dissolve in the developer while leaving the parts which are not irradiated with the electron beams unremoved, thereby forming openings 32a as shown in FIG. 3 (e) (developing step). If ZEP available from Zeon Corporation is used as the resist layer 32, amyl acetate can be used as the developer, for example Next, as shown in FIG. 3 (f), a mask layer 36 is formed on the concave-convex film 22 with the patterned resist layer 32 (mask layer forming step). In this way, the mask layer 36 is patterned on the concave-convex film 22 using electron beam irradiation. The mask layer 36 is made of, for example, Ni and is formed by sputtering process, vacuum deposition process or CVD process, for example. The mask layer 36 may have any thickness such as 20 nm.

FIG. 4 is a view explaining manufacture of the glass substrate with a concave-convex film: (a) shows a condition where the resist layer is removed completely; (b) shows a condition where the concave-convex film is etched using the mask layer as a mask; and (c) shows a condition where the mask layer is removed.

As shown in FIG. 4 (a), the resist layer 32 is removed with a peeling solution (resist layer removing step). As an example, the resist layer 32 can be removed by dipping the resist layer 32 in the peeling solution and exposing the resist layer 32 to ultrasonic irradiation. More specifically, diethyl ketone can be used as the peeling solution. As a result, the mask layer 36 is formed into a reverse pattern of the pattern of the openings 34a of the stencil mask 34.

Then, as shown in FIG. 4 (b), the concave-convex film 22 is dry etched using the mask layer 36 as a mask (etching step). This can transfer the reverse pattern of the pattern of the openings 34a of the stencil mask 34 to the concave-convex film 22. The mask layer 36 has higher resistance to an etching gas than the concave-convex film 22, so that parts of the concave-convex film 22 not covered with the mask layer 36 can be etched selectively. The etching is finished when the concave-convex film 22 is etched to an expected depth. If $SiO_2$ is used to form the concave-convex film 22, a fluorine-based gas such as $CF_4$ or $SF_6$ is used as the etching gas. If $Al_2O_3$ is used to form the concave-convex film 22, a fluorine-based gas or a chlorine-based gas such as $BCl_3$ is used as the etching gas. An inductively-coupled plasma dry etching device can be used as a dry etching device.

Next, as shown in FIG. 4(c), the mask layer 36 remaining unremoved on the concave-convex film 22 is removed with a certain peeling solution (mask layer removing step). Regarding the peeling solution, if Ni is used to form the mask layer 36, the mask layer 36 can be removed by dipping the mask layer 36 in the peeling solution containing hydrochloric acid and nitric acid diluted with water and mixed in a ratio of about 1:1. The mask layer 36 can also be removed by being dry etched with argon gas. The glass substrate 2 with a concave-convex film is formed as a result of the foregoing steps.

According to the aforementioned method of manufacturing the glass substrate with a concave-convex film, the subject film is formed on the glass substrate 21 and then the concave-convex structure 26 is formed. This allows selection of a material for the subject film more advantageous to processing than a material for the glass substrate 21, so that the concave-convex structure 26 can be formed precisely. This allows the concave-convex structure 26 to achieve expected optical performance, thereby enhancing the performance of a device in which the glass substrate 2 with a concave-convex film is used.

In this embodiment, asperities are formed by dry etching. Thus, the resultant asperities can be finer and deeper than those obtained by wet etching, thereby achieving processing with good reproducibility. More specifically, this embodiment allows processing precisely even if a concave-convex structure of a period is less than 1 μm, which had been conventionally difficult.

The glass substrate 21 is made of multiple oxides. Hence, processing the glass substrate 21 directly produces a mixture of materials placed in different vapor pressures during dry etching so that etching cannot proceed stably. Meanwhile, the subject film is made of a single material, so that it can be etched more stably than the glass substrate 21.

While the resist pattern is described as being formed by electron beam irradiation using a stencil mask, it may also be formed by nanoimprint technology. What is important is to form a subject film made of a single material on a glass substrate made of multiple oxides and to form asperities in the subject film by dry etching.

Next, a method of manufacturing the solar cell 1 is described.

First, the transparent conductive film 3 made of a transparent conductive material is deposited on the glass substrate 2 with a concave-convex film by deposition process such as CVD process or sputtering process (transparent conductive film forming step). The transparent conductive film 3 is made of, for example, $SnO_2$ with a thickness of from 0.3 μm to 2 μm, for example. In this embodiment, the thickness of the transparent conductive film 3 is determined such that the concave-convex structure 3b resulting from the concave-convex structure 26 of the concave-convex film 22 is formed in the lower surface 3a. Specifically, the thickness of the transparent conductive film 3 is made relatively small to make the concave-convex structure 3b same as the concave-convex structure 26 of the concave-convex film 22 appear in the lower surface 3a.

Next, the photoelectric conversion layer 4 is formed by plasma CVD process on the transparent conductive film 3 (photoelectric conversion layer forming step). More specifically, by plasma CVD process, for example, $SiH_4$ gas, $H_2$ gas and $B_2H_6$ gas are introduced into a deposition chamber. Then, in a condition that realizes deposition of an amorphous silicon film, the p-type semiconductor layer 41 is formed on the entire transparent conductive film 3. Next, by plasma CVD process, for example, $SiH_4$ gas and $H_2$ gas are introduced into the deposition chamber. Then, in a condition that realizes deposition of an amorphous silicon film, the i-type semiconductor layer 42 is deposited on the entire p-type semiconductor layer 41. Next, by plasma CVD process, $SiH_4$ gas, $H_2$ gas, and $PH_3$ gas are introduced for example into the deposition chamber. Then, in a condition that realizes deposition of an amorphous silicon film, the n-type semiconductor layer 43 is formed on the entire i-type semiconductor layer 42. The p-type semiconductor layer 41, the i-type semiconductor layer 42, and the n-type semiconductor layer 43 of the photoelectric conversion layer 4 are formed to respective thicknesses of 10 nm, 400 nm and 10 nm in this order, for example.

In the photoelectric conversion layer 4, a concave-convex structure same as the concave-convex structure 3b of the transparent conductive film 3 can also be made to appear in a back surface by making the respective thicknesses of the layers 41, 42 and 43 relatively small. In order to make the transparent conductive film 3 and the photoelectric conversion layer 4 follow the concave-convex structure 26 of the concave-convex film 22, it is desirable that the concave-convex structure 26 has a high aspect ratio. Especially in this embodiment the concave-convex structure 26 is composed of the protrusions 27. This can particularly work to make the transparent conductive film 3 and the photoelectric conversion layer 4 follow the shape precisely, compared to the case where a concave-convex structure is composed of recesses. More particularly, if a layer to be formed on the concave-convex film is to follow the concave-convex structure 26, it is preferable that the height of the protrusions 27 be a quarter or more of a total thickness of the layer to follow the shape.

Next, the back surface reflection layer 5 and the back surface electrode layer 6 are formed on and above the n-type semiconductor layer 43 of the photoelectric conversion layer 4 (back surface forming step). In this embodiment, the back surface reflection layer 5 is formed by depositing ZnO doped with Al, Ga or B by sputtering process etc. The back surface electrode layer 6 is formed by depositing the Ag layer 61 and the Al layer 62 for example by sputtering process. The solar cell 1 of the structure of FIG. 1 is manufactured as a result of the foregoing steps. In each of the back surface reflection layer 5 and the back surface electrode layer 6, a concave-convex structure same as the concave-convex structure of the photoelectric conversion layer 4 can also be made to appear in a corresponding back surface by making the thickness of each of the layers 5 and 6 relatively small. In this embodiment, the photoelectric conversion layer 4, the back surface reflection layer 5, and the back surface electrode layer 6 follow the concave-convex structure 3b of the transparent conductive film 3.

According to the aforementioned method of manufacturing the solar cell 1, the thickness of the transparent conductive film 3 is determined so as to make the concave-convex structure 26 on the glass substrate 2 with a concave-convex film appear on the side of the back surface 3b. Thus, the concave-convex structure 3b can be formed further at the boundary between the transparent conductive film 3 and the photoelectric conversion layer 4. This allows formation of asperities using the concave-convex structure 26 of the glass substrate 2 without the need of forming asperities physically in the transparent conductive film 3.

Figure 5:
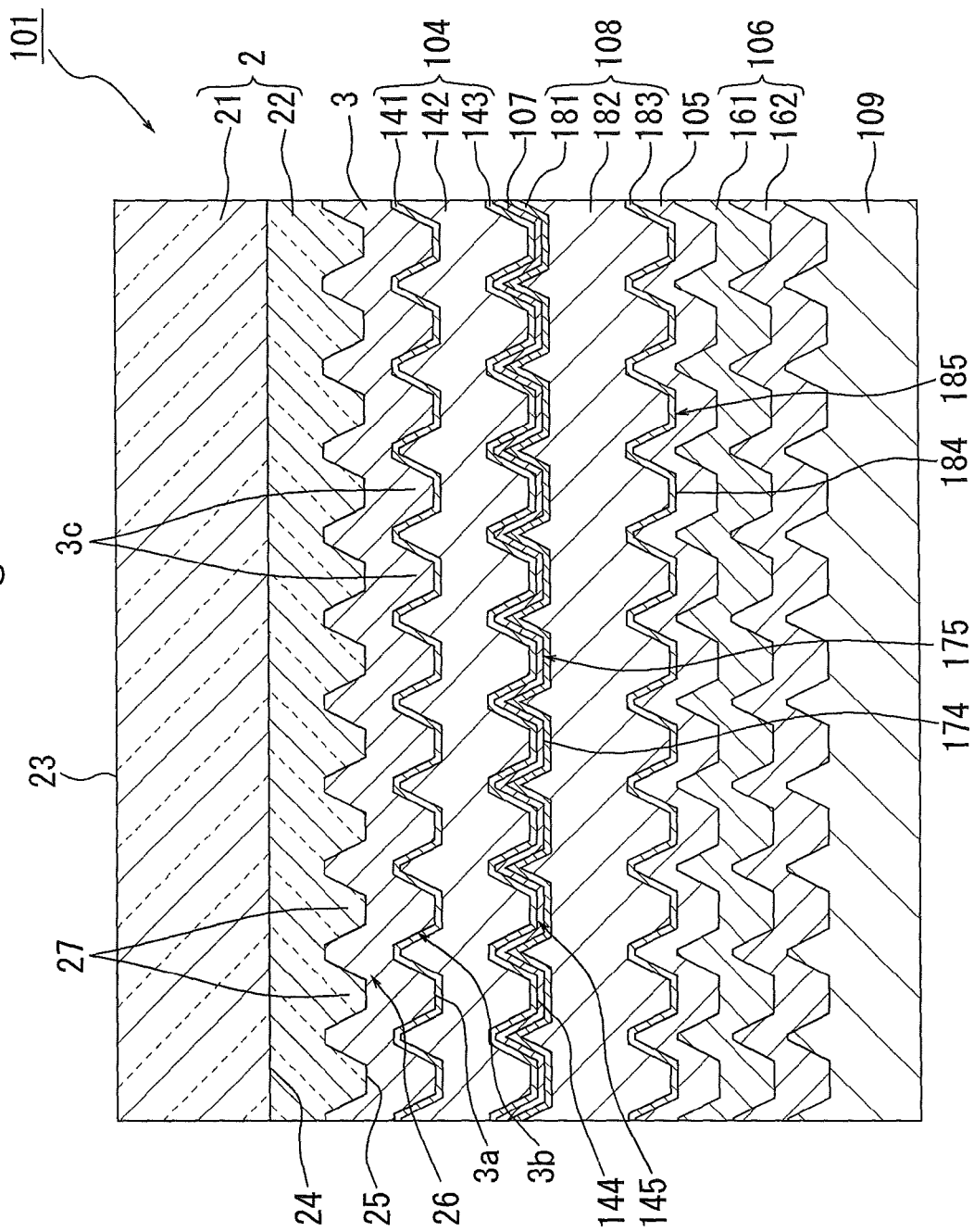
FIG. 5 is a schematic sectional view of a solar cell showing a modification.

The solar cell 1 described as an example in the aforementioned embodiment has one photoelectric conversion layer 4. Meanwhile, as shown for example in FIG. 5, a solar cell 101 with multiple photoelectric conversion layers including 104 and 108 can certainly be formed. FIG. 5 shows the tandem solar cell 1 including a photoelectric conversion layer 104 made of a-Si and a photoelectric conversion layer 108 made of μc-Si.

The solar cell 101 includes a glass substrate 2 with a concave-convex film, a transparent conductive film 3 formed on the glass substrate 2 with a concave-convex film, a first photoelectric conversion layer 104 formed on the transparent conductive film 3, an intermediate layer 107 formed on the first photoelectric conversion layer 104, a second photoelectric conversion layer 108 formed on the intermediate layer 107, a back surface reflection layer 105 formed on the second photoelectric conversion layer 108, a back surface electrode layer 106 formed on the back surface reflection layer 105, and a protective layer 109 formed on the back surface electrode layer 106. The solar cell 101 converts light having entered the solar cell 101 from the glass substrate 2 to electricity at the first and second photoelectric conversion layers 104 and 108. The glass substrate 2 with a concave-convex film and the transparent conductive film 3 are the same as those of the aforementioned embodiment, so that they are not descried here.

The first photoelectric conversion layer 104 is composed of semiconductor layers of a pin structure including a p-type semiconductor layer 141, an i-type semiconductor layer 142, and an n-type semiconductor layer 143 stacked sequentially. In this embodiment, the p-type semiconductor layer 141 and the i-type semiconductor layer 142 are each composed of an amorphous silicon film and have respective thicknesses of 10 nm and 400 nm, for example. The n-type semiconductor layer 143 is composed of a microcrystalline silicon film and has a thickness of 10 nm, for example. In this embodiment, the thickness of the first photoelectric conversion layer 104 is determined such that a concave-convex structure 145 resulting from the concave-convex structure 3b of the transparent conductive film 3 is formed in a lower surface 144.

The intermediate layer 107 is formed using a transparent conductive oxide such as ZnO or $SiO_x$. A particularly preferred oxide is ZnO or $SiO_x$ doped with magnesium Mg. The intermediate layer 107 can be formed by sputtering, for example. It is preferable that the intermediate layer 107 has a thickness that does not fall below 10 nm while not exceeding 200 nm. In this embodiment, the thickness of the intermediate layer 107 is determined such that a concave-convex structure 175 resulting from the concave-convex structure 145 of the first photoelectric conversion layer 104 is formed in a lower surface 174. Where necessary, the intermediate layer 107 can be omitted.

The second photoelectric conversion layer 108 is composed of semiconductor layers of a pin structure including a p-type semiconductor layer 181, an i-type semiconductor layer 182, and an n-type semiconductor layer 183 stacked sequentially. The second photoelectric conversion layer 108 has a narrower band gap than the first photoelectric conversion layer 104. In this embodiment, the p-type semiconductor layer 181, the i-type semiconductor layer 182, and the n-type semiconductor layer 183 are each composed of a microcrystalline silicon film and have respective thicknesses of 10 nm, 1.5 μm and 10 nm, for example. In this embodiment, the thickness of the second photoelectric conversion layer 108 is determined such that a concave-convex structure 185 resulting from the concave-convex structure 175 of the intermediate layer 107 is formed in a lower surface 184.

The wavelength of an absorption edge of microcrystalline silicon here is about 1200 nm. Light of a shorter wavelength can be absorbed by microcrystalline silicon. If the concave-convex film 22 is made of $SiO_2$, an optical wavelength determined in the concave-convex film 22 corresponding to the wavelength of this absorption edge is about 760 nm. If the transparent conductive film 3 is made of $SnO_2$, an optical wavelength determined in the transparent conductive film 3 is 550 nm. If the intermediate layer 107 is made of ZnO, an optical wavelength determined in the intermediate layer 107 is 570 nm. In this embodiment, the period of each of the concave-convex structures 26, 3b and 175 is shorter than a corresponding optical wavelength corresponding to the wavelength of the absorption edge of microcrystalline silicon.

The back surface reflection layer 105 and the back surface electrode layer 106 are formed on and above the concave-convex structure 185 on the second photoelectric conversion layer 108. In this embodiment, the back surface reflection layer 105 is made of ZnO doped with Al, Ga or B and has a thickness of 50 nm. In this embodiment, the back surface electrode layer 106 is composed of an Ag layer 161 and an Al layer 162 stacked on the Ag layer 161. The respective thicknesses of the Ag layer 161 and the Al layer 162 are 75 nm.

The protective film 109 is formed on the back surface electrode layer 106. The protective film 109 can be made of a resin material such as EVA or polyimide.

In the solar cell 101 of the aforementioned structure, the first photoelectric conversion layer 104 having a wider band gap is arranged to be closer to the side of incidence of light and the second photoelectric conversion layer 108 having a narrower band gap is provided thereafter. This allows photoelectric conversion over a wide wavelength range of incident light.

In the solar cell 101, the period of the concave-convex structure 26 is shorter than an optical wavelength corresponding to the respective wavelengths of absorption edges of the first photoelectric conversion layer 104 and second photoelectric conversion layer 108. This allows light of a wavelength band permitting photoelectric conversion to enter the transparent conductive film 3 without loss. The period of the concave-convex structure 3b of the transparent conductive film 3 is shorter than an optical wavelength corresponding to the respective wavelengths of the absorption edges of the first photoelectric conversion layer 104 and second photoelectric conversion layer 108. This allows light of a wavelength band permitting photoelectric conversion to enter the first photoelectric conversion layer 104 without loss. Moreover, the period of the concave-convex structure 175 of the intermediate layer 107 is also shorter than an optical wavelength corresponding to the wavelength of the absorption edge of the second photoelectric conversion layer 108. This allows light of a wavelength band permitting photoelectric conversion at the second photoelectric conversion layer 108 to enter the second photoelectric conversion layer 108 without loss. In order to form the concave-convex structure 175 as intended in the intermediate layer 107, it is preferable that the height of the protrusions 27 of the concave-convex structure 26 be a quarter or more of a total thickness of the transparent conductive film 3, the first photoelectric conversion layer 104, and the intermediate layer 107.

Figure 6:
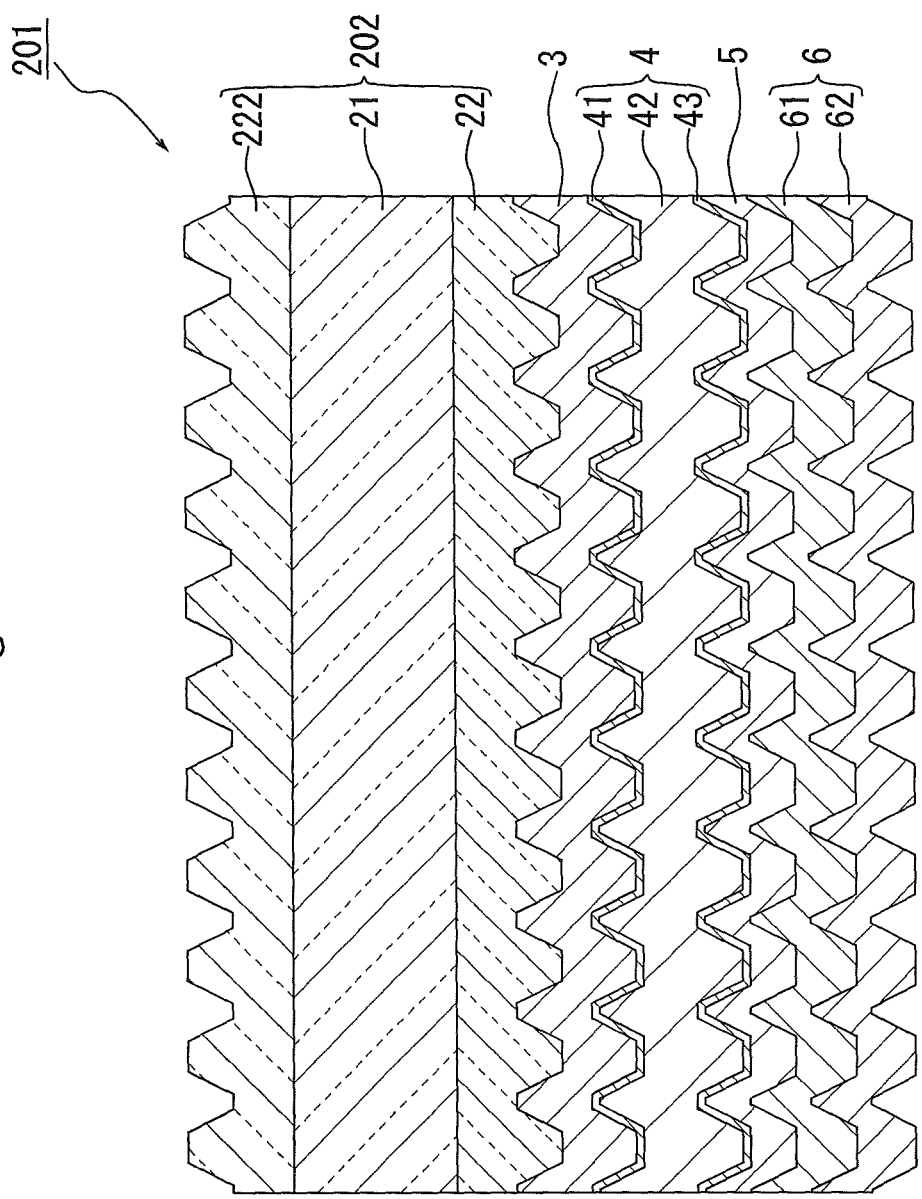
FIG. 6 is a schematic sectional view of a solar cell showing a modification.

In the aforementioned embodiment, the concave-convex film 22 is formed on one surface of the glass substrate 21. Meanwhile, as shown for example in FIG. 6, a glass substrate 202 with a concave-convex film is also applicable that includes a concave-convex film 22 and a concave-convex film 222 formed on opposite surfaces of the glass substrate 21. Additionally, in the aforementioned embodiment, the concave-convex film 22 is arranged on the lower surface side of the solar cell 1 and then the transparent conductive film 3 is formed. Meanwhile, the concave-convex film 22 may be arranged for example on the upper surface side of the solar cell 1. A solar cell 201 shown for example in FIG. 6 is also applicable where the concave-convex films 22 and 222 are formed on both the upper surface and the lower surface of the glass substrate 21. The concave-convex film 222 arranged on the upper surface of the glass substrate 21 can inhibit Fresnel reflection from occurring at a boundary with an external medium. This further allows the solar cell 1 to improve the power generating efficiency.

While the glass substrate 2 with a concave-convex film is described as being used in the solar cell 1 in the aforementioned embodiment, it may also be used in a different device. Other features such as a specific and detailed structure of the glass substrate 2 can be changed where appropriate.

INDUSTRIAL APPLICABILITY

This invention is industrially useful as it is capable of giving a fine concave-convex structure precisely to a glass substrate by dry etching.

REFERENCE SIGNS LIST

1 Solar cell
2 Glass substrate with concave-convex film
3 Transparent conductive film
3a Lower surface
3b Concave-convex structure
3c Protrusion
4 Photoelectric conversion layer
5 Back surface reflection layer
6 Back surface electrode layer
21 Glass substrate
22 Concave-convex film
23 Upper surface
24 Lower surface
25 Lower surface
26 Concave-convex structure
27 Protrusion
32 Resist layer
32a Opening
34 Stencil mask
34a Opening
36 Mask layer
41 P-type semiconductor layer
42 I-type semiconductor layer
43 N-type semiconductor layer
44 Lower surface
101 Solar cell
104 First photoelectric conversion layer
105 Back surface reflection layer
106 Back surface electrode layer
107 Intermediate layer
108 Second photoelectric conversion layer
141 P-type semiconductor layer
142 I-type semiconductor layer
143 N-type semiconductor layer
144 Lower surface
145 Concave-convex structure
161 Ag layer
162 Al layer
174 Lower surface
175 Concave-convex structure
181 P-type semiconductor layer
182 I-type semiconductor layer
183 N-type semiconductor layer
184 Lower surface
185 Concave-convex structure
201 Solar cell
202 Glass substrate with concave-convex film
222 Concave-convex film

The invention claimed is:
1. A method of manufacturing a solar cell, comprising:
forming a subject film comprising a single material on a surface of a glass substrate by one of sputtering process, vacuum deposition process and chemical vapor deposition (CVD) process, the subject film having a refractive index substantially the same as a refractive index of the glass substrate, the glass substrate comprising a plurality of oxides whose vapor pressures during dry etching differ from each other;
forming a periodic concave-convex structure on a surface of the subject film by dry etching, the concave-convex structure having a period of less than 1 μm for asperities of the concave-convex structure;
depositing a transparent conductive film on the glass substrate with the concave-convex film to a thickness determined such that a concave-convex structure resulting from the concave-convex structure of the concave-convex film is formed in a surface of the transparent conductive film;
forming a photoelectric conversion layer on the transparent conductive film to a thickness determined such that a concave-convex structure resulting from the concave-convex structure of the transparent conductive film is formed in a surface of the photoelectric conversion layer; and
forming a back surface reflection layer and a back surface electrode layer on the photoelectric conversion layer to a thickness determined such that a concave-convex structure resulting from the concave-convex structure of the photoelectric conversion layer is formed in a surface of the back surface reflection layer and the back surface electrode layer, wherein the concave-convex structure of the concave-convex film and the concave-convex structure of the transparent conductive film each have a period less than an optical wavelength corresponding to a wavelength of an absorption edge of the photoelectric conversion layer.

2. The method of manufacturing a solar cell according to claim 1, wherein forming a second subject film comprising a single material on an other surface of the glass substrate, the second subject film having a refractive index substantially the same as a refractive index of the glass substrate; and forming a second periodic concave-convex structure on a surface of the second subject film by dry etching, the second concave-convex structure having a period of less than 1 μm for asperities of the second concave-convex structure.

3. A method of manufacturing a solar cell, comprising:

forming a subject film comprising a single material on a surface of a glass substrate by one of sputtering process, vacuum deposition process and chemical vapor deposition (CVD) process, the subject film having a refractive index substantially the same as that of the glass substrate, the glass substrate comprising a plurality of oxides whose vapor pressures during dry etching differ from each other;

forming a periodic concave-convex structure on a surface of the subject film by dry etching, the concave-convex structure having a period of less than 1 μm for asperities of the concave-convex structure;

depositing a transparent conductive film on the glass substrate with the concave-convex film to a thickness determined such that a concave-convex structure resulting from a concave-convex structure of the concave-convex film is formed in a surface of the transparent conductive film;

forming a first photoelectric conversion layer on the transparent conductive film to a thickness determined such that a concave-convex structure resulting from the concave-convex structure of the transparent conductive film is formed in a surface of the first photoelectric conversion layer;

forming an intermediate layer on the first photoelectric conversion layer to a thickness determined such that a concave-convex structure resulting from the concave-convex structure of the first photoelectric conversion layer is formed in a surface of the intermediate layer;

forming a second photoelectric conversion layer on the intermediate layer to a thickness determined such that a concave-convex structure resulting from the concave-convex structure of the intermediate layer is formed in a surface of the second photoelectric conversion layer; and forming a back surface reflection layer and a back surface electrode layer on the second photoelectric conversion layer to a thickness determined such that a concave-convex structure resulting from the concave-convex structure of the second photoelectric conversion layer is formed in a surface of the back surface reflection layer and the back surface electrode layer, wherein the concave-convex structure of the concave-convex film and the concave-convex structure of the transparent conductive film each have a period less than an optical wavelength corresponding to a wavelength of an absorption edge of the first photoelectric conversion layer, and the concave-convex structure of the concave-convex film, the concave-convex structure of the transparent conductive film, the concave-convex structure of the first photoelectric conversion layer, and the concave-convex structure of the intermediate layer each have period shorter than an optical wavelength corresponding to a wavelength of an absorption edge of the second photoelectric conversion layer.

4. The method of manufacturing a solar cell according to claim 3, wherein the concave-convex of the transparent conductive film comprises protrusions in a dotted pattern, and the height of the protrusions is a quarter or more of a total thickness of a layer to follow the shape of the concave-convex structure.

5. The method of manufacturing a solar cell according to claim 3, wherein forming a second subject film comprising a single material on an other surface of the glass substrate, the second subject film having a refractive index substantially the same as a refractive index of the glass substrate, and forming a second periodic concave-convex structure on a surface of the second subject film by dry etching, the second concave-convex structure having a period of less than 1 μm for asperities of the second concave-convex structure.

6. A solar cell comprising:

a glass substrate including a plurality of oxides whose vapor pressures during dry etching differ from each other;

a concave-convex film which has a refractive index substantially the same as a refractive index of the glass substrate and comprises a single material on an one surface of the glass substrate by one of sputtering process, vacuum deposition process and chemical vapor deposition (CVD) process, a concave-convex structure of the concave-convex film having a period of less than 1 μm for asperities of the concave-convex structure;

a transparent conductive film which is deposited on the concave-convex film and has a concave-convex structure resulting from the concave-convex structure of the concave-convex film formed in a surface of the transparent conductive film;

a photoelectric conversion layer which is formed on the transparent conductive film and has a concave-convex structure resulting from the concave-convex structure of the transparent conductive film formed in a surface of the photoelectric conversion layer;

a back surface reflection layer which is formed on the photoelectric conversion layer and has a concave-convex structure resulting from the concave-convex structure of the photoelectric conversion layer formed in a surface of the back surface reflection layer; and a back surface electrode layer which is formed on the back surface reflection layer and has a concave-convex structure resulting from the concave-convex structure of the back surface reflection layer formed in a surface of the back surface electrode layer, wherein the concave-convex structure of the concave-convex film and the concave-convex structure of the transparent conductive film each have a period less than an optical wavelength corresponding to a wavelength of an absorption edge of the photoelectric conversion layer.

7. The solar cell according to claim 6, further comprising:

a second concave-convex film which has a refractive index substantially the same as that of the glass substrate and comprises a single material on an other surface of the glass substrate by sputtering process, vacuum deposition process or CVD process, a concave-convex structure of the second concave-convex film having period of less than 1 μm for asperities of the concave-convex structure.

8. The solar cell according to claim 7, wherein
the concave-convex structure of the concave-convex film has a flat part parallel to the glass substrate.

9. The solar cell according to claim 6, wherein
the concave-convex structure of the concave-convex film has a flat part parallel to the glass substrate.

10. A solar cell comprising:
a glass substrate including a plurality of oxides whose vapor pressures during dry etching differ from each other;
a concave-convex film which has a refractive index substantially the same as a refractive index of the glass substrate and comprises a single material on an one surface of the glass substrate by one of sputtering process, vacuum deposition process and chemical vapor deposition (CVD) process, a concave-convex structure of the concave-convex film having a period of less than 1 μm for asperities of the concave-convex structure;
a transparent conductive film which is deposited on the concave-convex film and has a concave-convex structure resulting from the concave-convex structure of the concave-convex film formed in a surface of the transparent conductive film;
a first photoelectric conversion layer which is formed on the transparent conductive film and has a concave-convex structure resulting from the concave-convex structure of the transparent conductive film formed in a surface of the first photoelectric conversion layer;
an intermediate layer which is formed on the first photoelectric conversion layer and has a concave-convex structure resulting from the concave-convex structure of the first photoelectric conversion layer formed in a surface of the intermediate layer;
a second photoelectric conversion layer which is formed on the intermediate layer and has a concave-convex structure resulting from the concave-convex structure of the intermediate layer formed in a surface of the second photoelectric conversion layer;
a back surface reflection layer which is formed on the second photoelectric conversion layer and has a concave-convex structure resulting from the concave-convex structure of the second photoelectric conversion layer formed in a surface of the back surface reflection layer; and
a back surface electrode layer which is formed on the back surface reflection layer and has a concave-convex structure resulting from the concave-convex structure of the back surface reflection layer formed in a surface of the back surface electrode layer, wherein
the concave-convex structure of the concave-convex film and the concave-convex structure of the transparent conductive film each have period shorter than an optical wavelength corresponding to a wavelength of an absorption edge of the first photoelectric conversion layer, and
the concave-convex structure of the concave-convex film, the concave-convex structure of the transparent conductive film, the concave-convex structure of the first photoelectric conversion layer, and the concave-convex structure of the intermediate layer each have period shorter than an optical wavelength corresponding to a wavelength of an absorption edge of the second photoelectric conversion layer.

11. The solar cell according to claim 10, further comprising:
a second concave-convex film which has a refractive index substantially the same as the refractive index of the glass substrate and comprises a single material on an another surface of the glass substrate by sputtering process, vacuum deposition process or CVD process, a concave-convex structure of the second concave-convex film having period of less than 1 μm for asperities of the concave-convex structure.

12. The solar cell according to claim 11, wherein
the concave-convex structure of the concave-convex film has a flat part parallel to the glass substrate.

13. The solar cell according to claim 10, wherein
the concave-convex structure of the concave-convex film has a flat part parallel to the glass substrate.

* * * * *